United States Patent [19]

Danby

[11] Patent Number: 4,641,090

[45] Date of Patent: Feb. 3, 1987

[54] POLYPHASE ELECTRICAL SIGNAL MEASURING APPARATUS

[75] Inventor: Philip Danby, Chestnut Hill, Mass.

[73] Assignee: Refac Electronics Corporation, Winsted, Conn.

[21] Appl. No.: 663,222

[22] Filed: Oct. 22, 1984

[51] Int. Cl.⁴ .................. G01R 19/00; G01R 1/38; G01R 29/00

[52] U.S. Cl. ............................. 324/107; 324/115; 324/114

[58] Field of Search ............ 324/115, 107, 114, 127; 340/657, 658, 660, 664; 364/481, 483, 484

[56] References Cited

U.S. PATENT DOCUMENTS 3,778,801 12/1973 Nudelmont .................. 340/658
3,864,631 2/1975 Zitelli et al. .................. 324/115

FOREIGN PATENT DOCUMENTS 0057978 8/1982 United Kingdom ............ 324/107

*Primary Examiner*—Reinhard J. Eisenzopf
*Assistant Examiner*—Vinh P. Nguyen
*Attorney, Agent, or Firm*—McCormick, Paulding & Huber

[57] ABSTRACT

Apparatus is provided for simultaneously measuring and displaying voltage, current and frequency in a polyphase alternating current system. The apparatus is operable in either a line-to-line or a line-to-neutral measuring mode without rewiring the apparatus to the measured system. A logic circuit is selectively operated to connect the appropriate voltage lines associated with each phase of the system to the apparatus and LEDs associated with each phase light to indicate the phase selected for measurement. Multi-digit seven segment LED displays are provided for simultaneously indicating the voltage, current and frequency measured.

11 Claims, 4 Drawing Figures

POLYPHASE ELECTRICAL SIGNAL MEASURING APPARATUS

BACKGROUND OF THE INVENTION

The present invention relates to electrical signal measuring devices and deals more particularly with an apparatus or circuit for simultaneously measuring and displaying the voltage, current and frequency for a selected phase in a polyphase alternating current system.

Apparatus for measuring voltage or current in polyphase systems generally include expensive and hard to read analog meters for indicating the magnitude of the measured voltage or current. Such measuring apparatus is often cumbersome to use and difficult to connect or wire to the involved system. Generally, a separate meter is required to display the voltage or current associated with each leg or phase of the system.

A single meter is sometimes used for indicating voltage or current by switching it to the desired phase to be measured. In such cases a rotary switch or other such electromechanical transferring device is usually used to selectively connect the meter to the appropriate leg of the system associated with the phase to be measured, and the switch or other device used must be capable of withstanding breakdown caused by the high voltages and currents generally associated with polyphase systems.

The high current in a polyphase alternating current system is usually reduced to a lower value by a current transformer to permit usage of a standard current meter connected to the transformer to indicate the value of a measured current. The transformer is connected so that its primary winding is in the circuit carrying the high current and its secondary winding is connected to current meter. Such a current transformer typically provides a current transformation from 500, 1,000 or 2,000 amperes to 5 amperes.

In the use of current transformer having a 5 ampere maximum applied secondary current and a standard 5 ampere current meter, for example, to measure the current flowing through the current transformer secondary winding, it is necessary in order for the meter to indicate the value of the current flowing in the primary circuit that the face of the meter be marked to reflect the transformation value of the current transformer to which the meter is connected. For example, a 500 ampere to 5 ampere transformer has a 100 to 1 transformation value and the face of a meter used with a transformer having such a transformation value is marked to indicate 100 amperes at the 1 ampere deflection point, 200 amperes at the 2 ampere deflection point and so forth. If a different transformer is used to measure a different maximum current flowing in the primary winding, the meter face must be either remarked or replaced by another face to reflect the transformation value of the different transformer. The remarking or replacing of a meter face is difficult and often time consuming and consequently, a number of meters having different faces are usually stocked for use with a number of different current transformers having different transformation values.

It is therefore a general aim of the present invention to provide apparatus for simultaneously measuring and displaying in digital readout format voltage, current and frequency values relative to a polyphase alternating current electrical system.

Another aim of the present invention to provide apparatus for measuring electrical signals in a polyphase alternating current system that can be used with a number of standard current transformers without requiring rewiring of the apparatus when transformers are changed.

A further aim of the present invention is to provide measuring apparatus that can selectively choose for measurement any one phase of the involved polyphase system.

A yet further aim of the present invention is to provide measuring apparatus that can be selectively conditioned to operate in a line-to-line or a line-to-neutral measuring mode.

A yet further aim of the present invention is to provide measuring apparatus that is easily read, inexpensive and easily manufactured using standard components.

The above and other features and advantages of the invention will be apparent from the following detailed description of a solid-state semiconductor implemented measuring apparatus, and from the claims, taken in conjunction with the accompanying drawings.

SUMMARY OF THE INVENTION

The present invention resides in apparatus for simultaneously measuring and displaying voltage, current and frequency in a polyphase alternating current system. Means are provided for coupling voltage lines associated with each phase of the system to the apparatus. Other means are provided for coupling standard current transformers, inserted in series with each phase of the system, to the apparatus.

In accordance with a more specific aspect of the invention, the measuring apparatus includes means making it selectively operable in a line-to-line or a line-to-neutral measuring mode without rewiring it to the measured system. Other means are provided for selectively choosing any one phase of the involved system.

DETAILED DESCRIPTION

Figure 1:
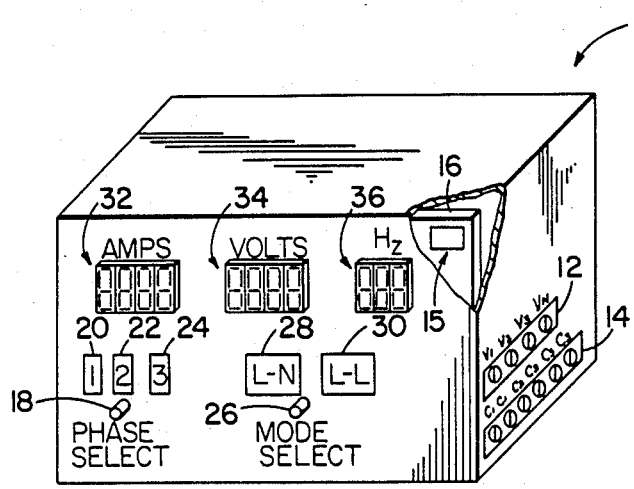
FIG. 1 is a perspective view of a measuring apparatus embodying the present invention and for use with a three-phase alternating current system.

Turning now to the drawings, and considering FIG. 1 in particular, an apparatus embodying the present invention is shown in a perspective view and is designated generally by the numeral 10. For purposes of explanation in the following discussion, it is assumed that the apparatus is used with a three-phase alternating current system. Briefly, the apparatus 10 includes terminal strips 12 and 14, respectively, for connecting the voltage lines and current transformers of the three-phase system to circuit means, designated generally at 15, mounted on a circuit board 16 and described in more detail below. A switch 18 of the momentary push-button type, preferably touch sensitive is used to condition the circuit means 15 to select the desired phase to be measured. The switch 18 is repeatedly operated until the desired phase is selected and identified by an indicator LED (light emitting diode) 20, 22, or 24 to indicate phase 1, 2 or 3, respectively. Another switch 26 of the momentary push-button type, and preferably touch sensitive is operable to select either a line-to-neutral or a line-to-line measuring mode, indicated by LED 28 or 30, respectively. A four-digit LED display designated generally at 32 is used to display the magnitude of a measured current in amperes. A second four-digit LED display designated generally at 34 is used to indicate the magnitude of a measured voltage, and a three-digit LED display designated generally at 36 is used to indicate a measured frequency. From the foregoing it is therefore seen that the apparatus 10 simultaneously measures and displays the line-to-neutral or line-to-line voltage, current and frequency of a selected phase.

Figure 2:
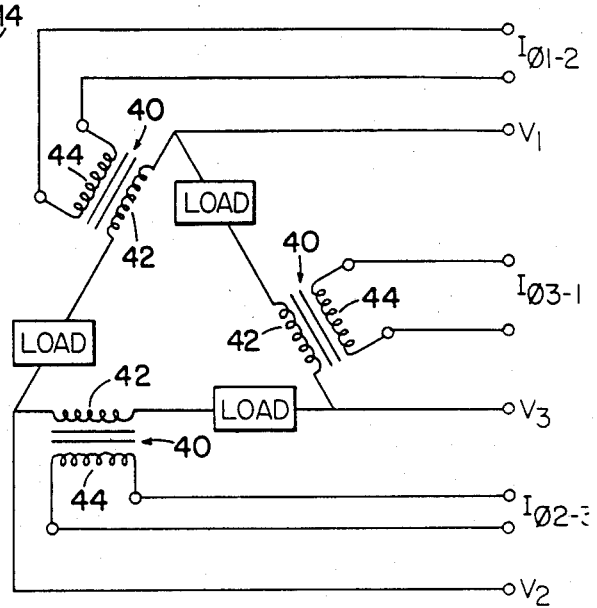
FIG. 2 is a schematic diagram of a delta configured three-phase system having both a load and a current transformer in each leg.
Figure 3:
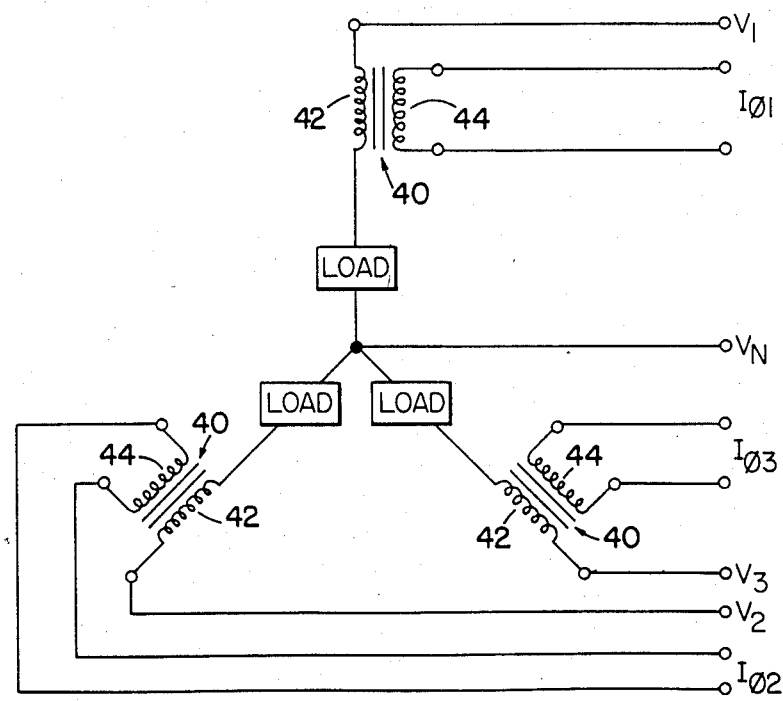
FIG. 3 is a schematic diagram of a wye configured three-phase system having both a load and a current transformer in each leg.

Referring now to FIGS. 2 and 3, schematic diagrams of delta and wye configured three-phase systems, respectively, are illustrated showing a load and a current transformer 40 in each leg or line of the system. Each current transformer 40 comprises a primary winding 42 and a secondary winding 44. In the illustration shown in FIGS. 2 and 3, the primary winding 42 of each transformer 40 is in series with the load in each line of the involved three-phase system. The secondary winding 44 has terminals which are used to connect the winding to a standard current meter or other measuring apparatus such as, for example, measuring apparatus embodying the present invention. Each current transformer 40 shown in FIG. 2 is connected to sense line-to-line current and each current transformer shown in FIG. 3 is connected to sense line-to-neutral current. The configuration and operation of delta and wye three-phase systems are generally well known and understood in the art and are included here for exemplary purposes only to illustrate connections of the voltage lines and current transformers to the apparatus of the present invention as described below.

Figure 4:
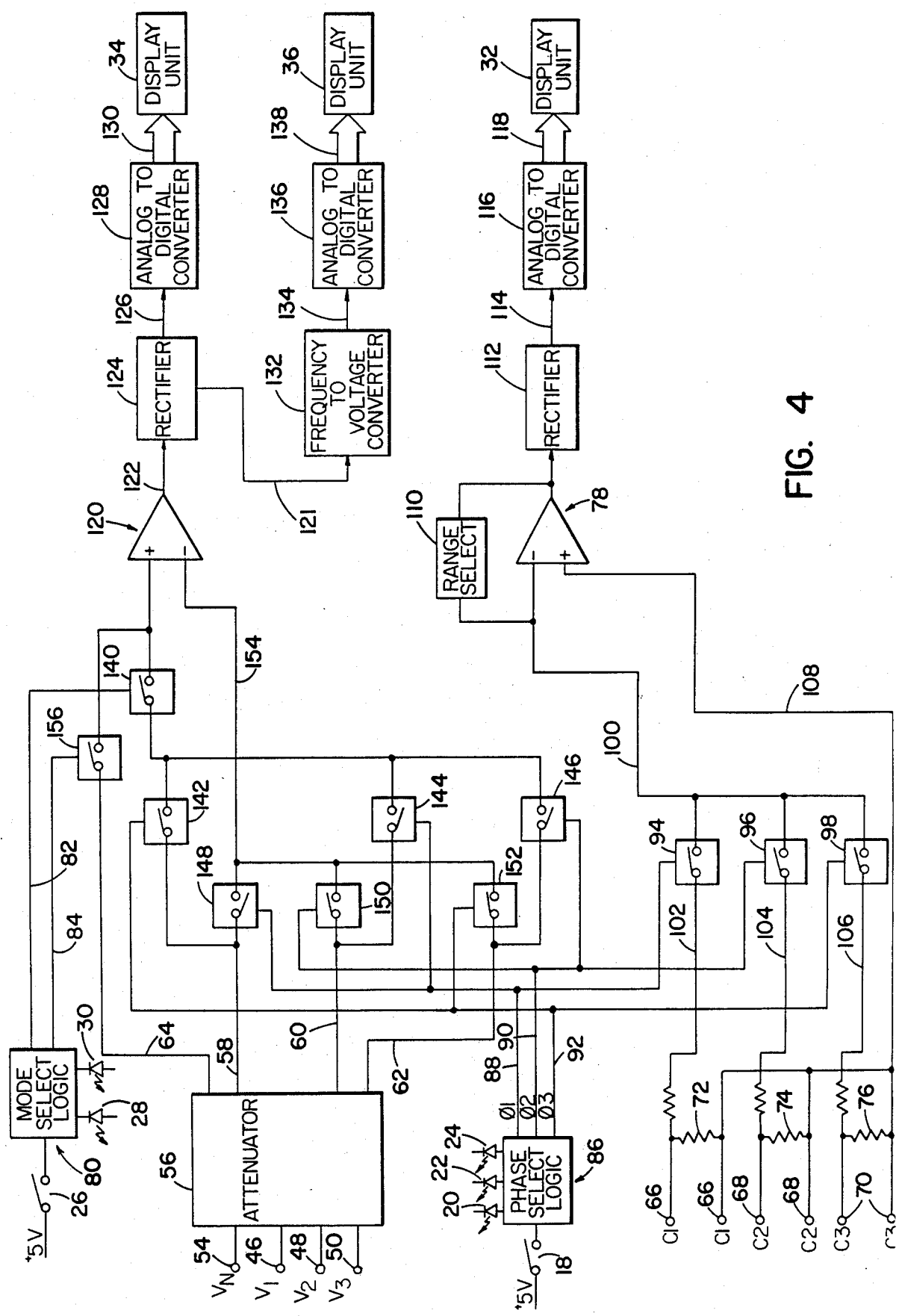
FIG. 4 is a schematic circuit diagram partially in block diagram form of the apparatus of FIG. 1.

Turning now to FIG. 4, a schematic circuit diagram partially in block diagram form of the apparatus 10 of FIG. 1 is shown therein. Voltage connections from a three-phase system are made to the apparatus via terminals 46, 48 and 50 of terminal strip 12 when line-to-line voltage measurements are to be made, and via terminals 46, 48, 50 and 54 when line-to-neutral voltage measurements are to be made. An attenuator 56 functions as a voltage divider to reduce the high voltages which are commonly present in three-phase power systems to lower magnitude voltages, appearing across lines 58, 60, 62 and 64, for compatability with the solid-state semiconductor devices used in the apparatus.

Connections to the secondary windings of current transformers, such as shown at 40 in FIGS. 2 and 3, are made to terminal pairs 66,66, 68,68, or 70,70, respectively, of terminal strip 14 for each of the three lines of the involved three-phase system. A resistor 72, 74 or 76 in parallel with an associated terminal pair senses the current, when present, to develop a voltage drop proportional to the current flowing through it. The resistor 72, 74 or 76 is selected to provide a maximum voltage drop of 250 millivolts when 5 amperes is present in the transformer secondary. The voltage drop across each resistor is coupled, as explained below, to the input of a switched gain operational amplifier designated generally at 78.

A mode select logic circuit 80 is used to select between line-to-line and line-to-neutral measuring operation. The input of the logic circuit 80 is connected to switch 26 which switch when operated momentarily connects a positive voltage to the input to toggle the circuit. When line-to-line operation is selected, a positive voltage signal appears on the output line 82 and LED 30 is caused to light indicating that the line-to-line mode is selected. When switch 26 is again operated, the logic circuit 80 output changes state and now provides a positive voltage on lead 84, and LED 28 is caused to light indicating that the line-to-neutral mode is selected. Functionally, the mode select logic circuit 80 is a flip-flop.

A phase select logic circuit designated generally at 86 is used to select a desired phase to be measured. The input of the logic circuit 86 is connected to switch 18 which switch when operated momentarily connects a positive voltage to the input to trigger the logic circuit. The logic circuit 86 steps each time switch 18 is operated, a positive voltage signal from output to output which output signal on lead 88, 90 or 92 corresponds to phase 1, 2 or 3 being selected respectively. LEDs 20, 22 and 24 associated with phase 1, 2 and 3 respectively light to indicate which phase is selected. Functionally, the phase select logic circuit 86 is a synchronous divide-by-three counter.

The input of switched gain amplifier 78 is connected to measure the voltage drop across resistor 72, 74 or 76 for phases 1, 2 or 3, respectively, via analog switches 94, 96 and 98. One side of the switches 94, 96 and 98 is connected to the inverting input of amplifier 78 by lead 100. The input to switch 94, 96 and 98 is connected to leads 102, 104 and 106 respectively and each of these leads is connected to one side of the associated one of the current sensing resistors 72, 74 and 76. The opposite sides of the current sensing resistors 72, 74 and 76 are connected to the non-inverting input of amplifier 78 via lead 108. Each of the switches 94, 96 or 98 close when a positive voltage is applied to its respective control terminal to complete the circuit path from one side of the associated one of the resistors 72, 74 or 76 to the amplifier 78. For example, switch 94 is closed when a positive voltage appears on lead 88 and corresponds to phase 1 being selected for measurement. Switch 96 is closed when a positive voltage appears on its control terminal connected to lead 90 and corresponds to phase 2 being selected. Switch 98 closes when a positive voltage appears at its control terminal connected to lead 92 and corresponds to phase 3 being selected.

The switched gain amplifier 78 has a switchable feedback circuit designated at 110 to select a gain compatible with the current transformer used in the three-phase circuit being measured to make the display unit 32 read correctly. The apparatus is designed to be compatible with a current transformer having a 5 ampere maximum applied secondary current. Therefore the output of amplifier 78 must be scaled to reflect the transformation value of the particular current transformer used; that is, for example, a 500 ampere rated current transformer corresponds to a 500 ampere range being selected in the circuitry 110 and a 2,000 ampere current transformer corresponds to a 2,000 ampere range being selected.

A rectifier 112 is connected to the output of amplifier 78 and provides a rectified, filtered DC voltage on its ouput lead 114 proportional to the AC voltage signal present at its input. The output of rectifier 112 is fed to an analog-to-digital convertor 116. The convertor 116 senses the DC level present at its input and converts the signal to a digital formated signal or digital word representative of the DC level present at its input. The digitally formatted word is decoded and applied to a segment driver bus 118 in the proper digital signal format to drive the four-digit LED display unit 32. The display unit 32 provides an numeric representation of the magnitude of the current flowing through the current transformer primary winding in the leg of the selected phase.

Considering now the measurement of voltage in the involved system connected to the apparatus, a differential input instrumentation amplifier circuit designated generally at 120 senses and amplifies a voltage, when present across its input terminals, to provide an amplified AC signal at its output connected to lead 122. The output 122 is connected to the input of a DC rectifier 124 which operates similarly to the rectifier 112 described above. The rectifier 124 provides a DC voltage signal at its output connected to lead 126 which output signal is proportional to the magnitude of the voltage being measured in the involved system. An analog-to-digital convertor 128 operates similarly to the analog-to-digital convertor 116 described above. The output of the analog-to-digital convertor 128 provides the proper decoded digitally formatted signals on a segment display bus 130 to drive the four-digit LED display unit 34 to display in numeric form the magnitude of the voltage measured for the selected phase.

In the illustrated embodiment, rectifier 124 conditions the AC output signal of amplifier 120 and couples the signal to the input of a frequency-to-voltage convertor 132 via lead 121. The frequency-to-voltage convertor 132 senses the conditioned AC signal for the selected phase and provides a DC voltage signal at its output. The output is connected to lead 134 and is proportional to and representative of the frequency of the line voltage. The DC signal on lead 134 is connected to an analog-to-digital convertor 136 which operates similarly to the analog-to-digital convertors 116 and 128 described above. A BCD signal representative of the measured frequency is applied to a segment display bus 138 which drives the three-digit LED display unit 36 to display in numeric form the frequency of the selected line.

Although any number of digital display type devices can be used with the apparatus, LED seven segment displays are preferable to other types because of their better visibilty in varying ambient light conditions and their readability from distances as much as 30 feet away.

The analog-to-digital convertor 116, 128 or 136 may be implemented by a commercially available integrated circuit, such as, for example, one manufactured by Teledyne Semiconductor and identified as Part No. TSC7107. The TSC7107 integrated circuit is a three and one-half digit direct display drive analog-to-digital convertor for driving a common anode seven segment light emitting diode display.

The frequency-to-voltage convertor 132 can be implemented by a commercially available integrated circuit which generates an output voltage which is linearly proportional to the input waveform frequency. Such a frequency-to-voltage device is manufactured and available from National Semiconductor and is identifed as No. LM331N or by Teledyne Semiconductor and identified as No. TSC9400. Basically, a frequency-to-voltage convertor of the above type detects the zero crossing of an input waveform and causes a precise amount of charge to be injected into an amplifier summing junction. This charge causes voltage pulses to be generated at the output of the amplifier and a capacitor averages these pulses into a DC voltage which is linearly proportional to the input frequency.

Still referring to FIG. 4, the operation of the analog switches to connect the proper voltage lines for measurement according to the phase selected is now considered. The following discussion further assumes that the line-to-line measuring mode is selected and consequently when a positive voltage signal appears on lead 82 and is applied to the control terminal of switch 140, the switch closes to connect the input of amplifier 120 to the outputs of switches 142, 144 and 146. The inputs to switches 142, 144 and 146 are connected to leads 58, 60 and 62 respectively. Switches 148, 150 and 152 have their respective outputs connected to the inverting input of amplifier 120 via lead 154. The inputs to switches 148, 150 and 152 are connected to leads 58, 60 and 62 corresponding to the voltage lines 1, 2 and 3 respectively.

Recalling that a positive voltage signal is present on one of the phase select leads 88, 90 or 92 when the phase associated with that lead is selected, assume that phase 1 is selected and a positive signal appears on lead 88. Lead 88 is connected to the control terminal of switches 148 and 142 thereby closing those switches when a positive signal is present on the lead. The closing of switches 144 and 148 connect the voltage appearing on lead 58 to lead 154 and the inverting terminal of amplifier 120. The line voltage appearing on lead 60 is connected to the non-inverting input of amplifier 120 through switches 144 and 140. Thus the input signal appearing across the differential input of amplifier 120 is the attenuated line-to-line voltage measured from line 1 to line 2.

Similarly, when a phase 2 is selected a positive signal appears on lead 90 and closes switches 150 and 146 to connect the voltage appearing on lead 60 to the inverting terminal of amplifier 120 and the voltage appearing on lead 62 is connected through switches 146 and 140 to the non-inverting terminal of amplifier 120. Thus the voltage signal appearing across the differential input of amplifier 120 is the attenuated line-to-line voltage measured from line 2 to line 3.

When phase 3 is selected, a positive signal appears on lead 92 and closes switches 142 and 152 to connect the voltage appearing on lead 58 to the non-inverting terminal of amplifier 120 through switches 142 and 140. The voltage appearing on lead 62 is connected to the inverting terminal of amplifier 120 through switch 152. The signal voltage appearing across the input terminals of amplifier 120 is the attenuated line-to-line voltage measured from line 3 to line 1.

When the line-to-neutral measuring mode is selected a positive voltage appears on lead 84 and closes switch 156 to connect the neutral line voltage appearing on lead 64 to the non-inverting input of amplifier 120. Switch 140 is now opened because the positive voltage applied to its control terminal is no longer present due to the state change of the mode select logic circuit 80.

Line-to-neutral voltages are selected for measurement through operation of the analog switches in much the same way as the line-to-line voltages are selected. For example, when phase 1 is selected a positive signal appears on lead 88 and closes switch 148 to connect the voltage appearing on lead 58 to the inverting terminal of amplifier 120 via lead 154. Thus the voltage appearing across the input terminals of amplifier 120 is the attenuated line-to-neutral voltage measured from line 1 to the neutral line. Similarly, when phase 2 is selected a positive signal appears on lead 90 and closes switch 150 to connect the voltage appearing on lead 60 to the inverting terminal of amplifier 120. Thus the voltage appearing across the input terminals of amplifier 120 is the voltage measured, from line 2, to the neutral line. When phase 3 is selected a positive signal appears on lead 92 and closes switch 152 to connect the voltage on lead 62 to the inverting terminal of amplifier 120. Thus the voltage across the input terminals of amplifier 120 is the attenuated line-to-neutral voltage measured from line 3 to the neutral line.

Apparatus for simultaneously measuring and displaying voltage, current and frequency in a polyphase alternating current system has been described in a preferred embodiment. It will be understood that numerous modification and subsitutions may be made without departing from the spirit of the invention. Therefore, the invention has been described by way of illustration rather than limitation.

I claim:

1. Apparatus for simulataneously measuring a magnitude and displaying a numerical representation of the measured magnitude for a voltage, current and frequency in a polyphase alternating current system, said apparatus comprising:
   means for coupling said polyphase alternating current system to said apparatus;
   means for selectively conditioning said apparatus to operate in either a line-to-line or a line-to-neutral measuring mode;
   means for selectively choosing for measurement any one phase of said polyphase system coupled to said apparatus;
   first display means for indication a magnitude of a measured voltage associated with a selected phase;
   second display means for indicating a magnitude of a measured current associated with a selected phase;
   third display means for indicating a measured frequency associated with a selected phase;
   first circuit means for sensing a voltage associated with a selected phase wherein said voltage is sensed line-to-line or line-to-neutral in accordance with said selected measuring mode, said first circuit means including first other circuit means for transforming said sensed voltage into a digital signal representative of the voltage magnitude of said sensed voltage to drive said first display means;
   second circuit means for sensing a current associated with a selected phase wherein said current is sensed line-to-line or line-to-neutral in accordance with said selected measuring mode, said second circuit meand including second other cirucit means for transforming said sensed current into a digital signal representative of the current magnitude of said sensed current to drive said second display means, and
   third circuit means for sensing a frequency associated with a selected phase, said third circuit means including other circuit means for transforming said sensed frequency signal into a digital signal representative of said sensed frequency signal to drive said third display means.

2. Apparatus for simultaneously measuring and displaying as defined in claim 1 further comprising indicator means for identifying the selected phase.

3. Apparatus for simulataneously measuring and displaying as defined in claim 2 further comprising said selected phase indicator means including LEDs, each selected phase of said polyphase system being identified by the energization an LED associated with the selected phase.

4. Apparatus for simultaneously measuring and displaying as defined in ciaim 1 further comprising indicator means for identifying one or the other of said line-to-line and line-to-neutral measuring mode selected.

5. Apparatus for simultaneously measuring and displaying as defined in claim 4 further comprising a measuring mode indicator means including other LEDs, each measuring mode being identified by the energization of one and another of said other LEDs associated with the selected mode.

6. Apparatus for simultaneously measuring and displaying as defined in claim 1 further comprising said second circuit means including means for selecting one of a number of predetermined current measuring ranges.

7. Apparatus for simulataneously measuring and displaying as defined in claim 1 further comprising said third circuit means including a frequency-to-voltage converter for producing a DC voltage signal representative of and proportional to said sensed frequency.

8. Apparatus for simultaneously measuring and displaying as defined in claim 1 further comprising said first, said second and said third other circuit means for transforming said sensed voltage, current and frequency signals including a first, second and third analog-to-digital converter, respectively;
   said first analog-to-digital converter having a first BCD output signal representative of the magnitude of said sensed voltage coupled to said first display means;
   said second analog-to-digital converter having a second BCD output signal representative of the magnitude of said sensed current coupled to said second display means, and
   said third analog-to-digital converter having a third BCD output signal representative of said sensed frequency coupled to said third display means.

9. Apparatus for simultaneously measuring and displaying as defined in claim 6 further including said second circuit means being coupled to said polyphase alternating current system by a current transformer having an input winding and an output winding and a predetermined current transformation value, said current transformer being selected so that the maximum current flowing in a selected phase of the polyphase system is within the maximum range of the current transformer, said current transformer having the same predetermined maximum magnitude of current flowing in the output winding for each of the maximum ranges and current transformation values associated with a given current transformer, said apparatus further comprising said second circuit means including a variable gain amplifier coupled between the output winding of a current transformer and said second other circuit means, said amplifier having means for selectively scaling the gain of said amplifier to match a predetermined current transformation value to cause said second display means to provide a numerical representation corresponding to the magnitude of a current flowing in the input winding of said current transformer associated with a selected phase.

10. Apparatus for simultaneously measuring and displaying as defined in claim 1 further comprising a current sensing resistor coupled across the output winding of said current transformer for producing a current related voltage proportional to the current flowing in the output winding, said current related voltage being applied across the input of said variable gain amplifier.

11. Apparatus for simultaneously measuring and displaying as defined in claim 1 wherein:
said first display means comprises a first four digit LED seven segment display device;
said second display means comprises a second four digit LED seven segment display device, and
said third display means comprises a three digit LED seven segment display device.

* * * * *